(12) United States Patent
Hussin et al.

(10) Patent No.: US 8,546,936 B2
(45) Date of Patent: Oct. 1, 2013

(54) METHOD AND STRUCTURE OF MINIMIZING MOLD BLEEDING ON A SUBSTRATE SURFACE OF A SEMICONDUCTOR PACKAGE

(75) Inventors: Pakhorudin Hussin, Kedah (MY); Murugasan Manikam Achari, Penang (MY); Tee-Eu Jin, Penang (MY); Kwet Nam Wong, Penang (MY)

(73) Assignee: Spansion LLC, Sunnyvale, CA (US)

( * ) Notice: Subject to any disclaimer, the term of this patent is extended or adjusted under 35 U.S.C. 154(b) by 775 days.

(21) Appl. No.: 12/818,866

(22) Filed: Jun. 18, 2010

(65) Prior Publication Data

US 2010/0258705 A1 Oct. 14, 2010

Related U.S. Application Data

(62) Division of application No. 11/895,901, filed on Aug. 28, 2007, now Pat. No. 7,759,171.

(51) Int. Cl.
*H01L 23/10* (2006.01)
*H01L 21/00* (2006.01)

(52) U.S. Cl.
USPC .......................................... 257/710; 438/127

(58) Field of Classification Search
USPC .......... 257/687, 710, 787–796; 438/112–127
See application file for complete search history.

(56) References Cited

U.S. PATENT DOCUMENTS

| | | |
|---|---|---|
| 3,487,561 A | 1/1970 | Azure et al. |
| 3,624,475 A | 11/1971 | Smith |
| 3,662,290 A | 5/1972 | Elliott |
| 3,902,123 A | 8/1975 | Oomen |
| 4,541,043 A | 9/1985 | Ballegeer et al. |
| 4,676,660 A | 6/1987 | King et al. |
| 5,130,578 A | 7/1992 | Stone et al. |
| 5,297,173 A | 3/1994 | Hikmet et al. |
| 5,408,197 A | 4/1995 | Miyake |
| 5,473,571 A | 12/1995 | Shigematsu et al. |
| 5,617,451 A | 4/1997 | Mimura et al. |
| 5,666,167 A | 9/1997 | Tults |
| 5,945,850 A | 8/1999 | Segan et al. |
| 6,710,605 B2 | 3/2004 | Tang et al. |
| 7,663,342 B2 | 2/2010 | Kimball et al. |
| 7,759,171 B2 * | 7/2010 | Hussin et al. ................. 438/127 |
| 2001/0031026 A1 | 10/2001 | Kohl et al. |
| 2004/0190913 A1 | 9/2004 | Seo et al. |
| 2005/0226017 A1 | 10/2005 | Kotsopoulos et al. |
| 2006/0170479 A1 | 8/2006 | Hirata et al. |

(Continued)

OTHER PUBLICATIONS

Karthaus et al., "Fully Integrated Passive UHF RFID Transponder IC with 16.7 micro-W Minimum RF Input Power," IEEE Journal of Solid State Circuits, vol. 38, No. 10. pp. 1602-1608 (Oct. 2003).
Curty et al., "Remotely Powered Addressable UHF RFID Integrated System," IEEE Journal of Solid State Circuits, vol. 40, No. 11, pp. 2193-2202 (Nov. 2005).

(Continued)

*Primary Examiner* — Calvin Lee

(57) ABSTRACT

A substrate surface of a semiconductor package, comprising: a plurality of product forming areas to provide mounting spaces of semiconductor chips. The substrate surface also comprises a plurality of staggered offset mesh block areas surrounding the plurality of product forming areas. The plurality of staggered offset mesh block areas minimize mold bleeding from a mold cavity of the semiconductor package to outer areas of the substrate surface.

15 Claims, 6 Drawing Sheets

(56) References Cited

U.S. PATENT DOCUMENTS

2007/0143080 A1    6/2007   Yancey
2008/0079542 A1    4/2008   Rofougaran
2008/0278293 A1   11/2008   Drucker
2008/0290906 A1   11/2008   Chou et al.
2010/0135430 A1    6/2010   Oh et al.
2010/0271067 A1   10/2010   Cauli et al.

OTHER PUBLICATIONS

Zhu, "RFID Analog Front End Design Tutorial," Univ. of Adelaide (Jan. 2004).
"EPC Radio-Frequency Protocols Class-1 Generation-2 UHF RFID Protocol for Communications at 860 MHz-960 MHz", Version 1.0.9, Jan. 2005, pp. 1-94.

* cited by examiner

METHOD AND STRUCTURE OF MINIMIZING MOLD BLEEDING ON A SUBSTRATE SURFACE OF A SEMICONDUCTOR PACKAGE

CROSS-REFERENCES TO RELATED APPLICATIONS

This is a Divisional of U.S. patent application Ser. No. 11/895,901, filed Aug. 28, 2007, now U.S. Pat. No. 8,55,973 issued Jul. 20, 2010, the disclosure of which is incorporated herein in its entirety by reference.

FIELD OF TECHNOLOGY

This disclosure relates generally to technical fields of semiconductor manufacturing, in one embodiment, to a method and structure of minimizing mold bleeding on a substrate surface of a semiconductor package.

BACKGROUND

Semiconductor dice and their interconnections are sealed within a package of plastic or other moldable material (e.g., thermosetting resin) to protect the semiconductor dice and their interconnections from physical and/or environmental stresses (e.g., dust, heat, moisture, static electricity, and/or mechanical shocks). The plastic or other moldable material (e.g., liquefied) is fed into cavities of a mold (e.g., formed between the upper part of the mold and the substrate surface of the semiconductor dice) to fill the cavities, thus flowing over the semiconductor dice and their interconnections.

The plastic or moldable material is then hardened to encapsulate the semiconductor dice and their interconnections. Air formed during the molding process is expelled through one or more airvents formed on the substrate surface. Through the one or more airvents, the plastic or moldable material could flow outside the cavities, thus resulting in mold bleeding. The mold bleeding may be worsened when outer edges of the substrate surface (e.g., surrounding the cavities) use an aligned mesh block design (e.g., of FWD 137 package, BNA 202, etc.) to achieve a better warpage performance. The aligned mesh block design may create a drainage flow from the cavities, thus aggravating the mold bleeding on the edges of the substrate surface. Furthermore, the mold bleeding may also result when a gap between two adjacent areas of the aligned mesh block design is too wide.

As a result, the mold bleeding may decrease the quality of the package and/or degrade equipment used to encapsulate the semiconductor dice and their interconnections. Additionally, a subsequent process may be necessary to remove the mold bleeding (e.g., for aesthetic reason) from the substrate surface and/or the equipment. For these reasons or more, the mold bleeding may lead to low yield and/or low productivity in semiconductor manufacturing and/or process control.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a substrate surface of a semiconductor package, comprising: a plurality of product forming areas to provide mounting spaces of semiconductor chips. The substrate surface also comprises a plurality of staggered offset mesh block areas surrounding the plurality of product forming areas. The plurality of staggered offset mesh block areas minimize mold bleeding from a mold cavity of the semiconductor package to outer areas of the substrate surface.

As illustrated in the detailed description, other embodiments pertain to methods and structures that provide an improved molding process of the semiconductor package, and in particular, a reduction of mold bleeding on the substrate surface of the semiconductor package. Through forming the staggered offset mesh block areas on the outer area of the substrate surface, the embodiments provide semiconductor packages with a reduced mold bleeding problem.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments reduce the effect of mold bleeding in the substrate surface of semiconductor packages through forming staggered offset mesh block areas on the substrate surface. The staggered offset mesh block areas form dam structures to block the flow of mold material towards outer edges of the substrate surface. Additionally, an airvent is formed between two adjacent staggered offset mesh block areas to guide the flow of mold bleeding. By narrowing the width of the airvent, the mold bleeding may be reduced more effectively.

Figure 1:
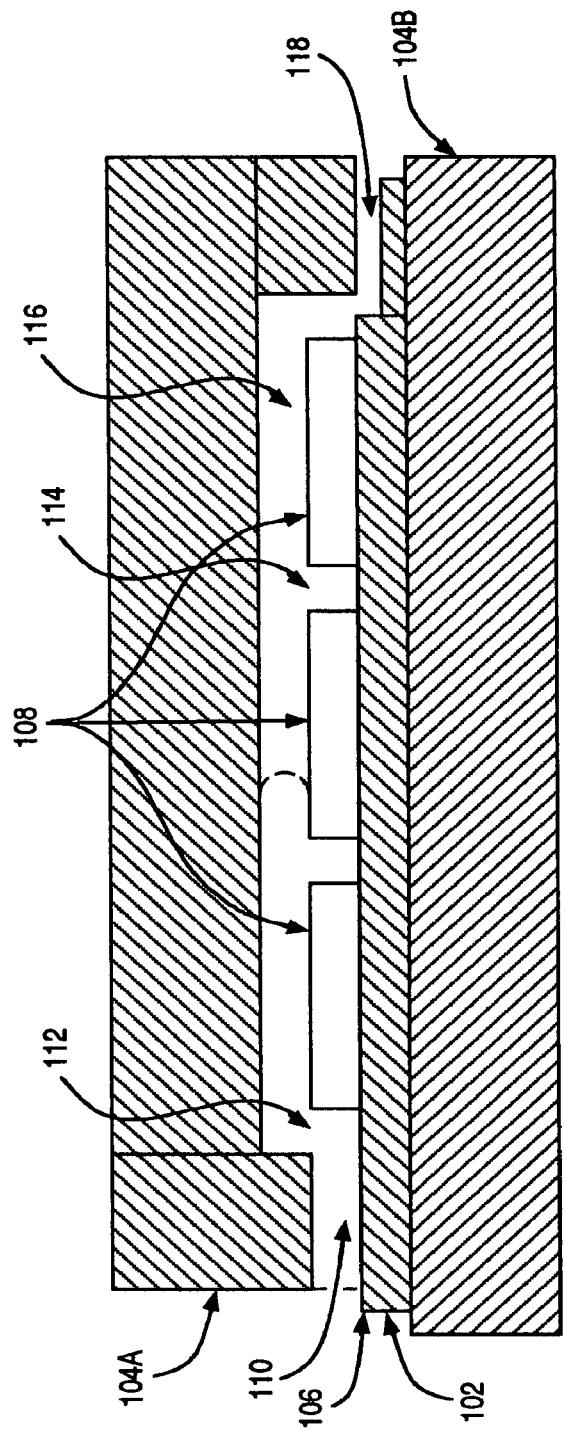
FIG. 1 is a cross sectional view of an airvent formed between a substrate surface and an upper mold plate, according to one embodiment.

FIG. 1 is a cross sectional view of an airvent 118 formed between a substrate surface 106 and an upper mold plate 104A, according to one embodiment. FIG. 1 illustrates a substrate 102, an upper mold plate 104A, a lower mold plate 104B, a substrate surface 106, semiconductor chips 108, a gate 110, a mold material 112, a mold cavity 114, air 116, and an airvent 118.

In FIG. 1, once the semiconductor chips 108 are mounted on the substrate surface 106, they are placed between the upper mold plate 104A and the lower mold plate 104B to initiate a molding process. It should be appreciated that the molding process may be achieved in many ways. In one example, the mold material 112 (e.g., plastic, epoxy resin, ceramic, etc.) is applied to the mold cavity 114 through the gate 110. As the mold cavity 114 is filled with the mold material 112, the air 116 is expelled outside the mold cavity 114 through the airvent 118. Although, the maximum particle diameter of the mold material 112 is set larger than the height of the airvent 118, the mold material 112 may escape the airvent 118 as it is liquefied to ease its flow within the mold cavity 114.

Figure 2:
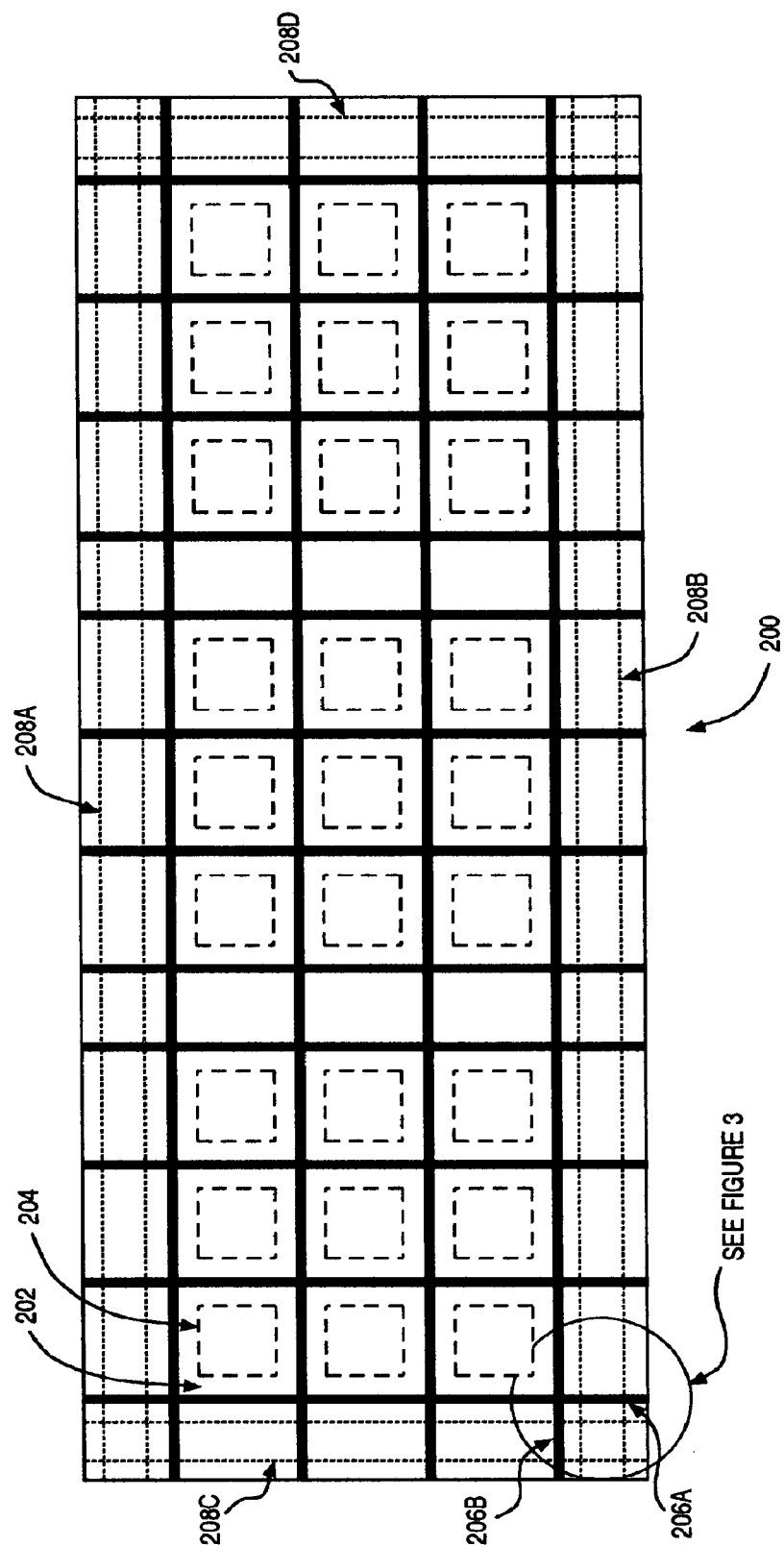
FIG. 2 is a schematic diagram of a semiconductor package with product forming areas surrounded by outer areas of the substrate surface of FIG. 1, according to one embodiment.

FIG. 2 is a schematic diagram of a semiconductor package 200 with product forming areas 202 surrounded by outer areas of the substrate surface 106 of FIG. 1, according to one embodiment. FIG. 2 illustrates the product forming areas 202, semiconductor chips 204, a longitudinal saw line 206A, a latitudinal sawline 206B, and the outer areas (e.g., the outer area 208A, the outer area 208B, the outer area 208C, and the outer area 208D). In FIG. 2, a panel of the semiconductor package 200 has twenty-seven semiconductor chips 204 (e.g., three rows by nine columns matrix of the semiconductor chips 204) placed on twenty-seven product forming areas 202. Dividing the twenty-seven product forming areas 202, twelve of the longitudinal sawline 206A (e.g., cutting axes) and three of the latitudinal sawline 206B crisscross the panel of the semiconductor package 200.

Surrounding the product forming areas 202, the outer area 208A, the outer area 208B, the outer area 208C, and the outer area 208D are formed. The outer areas may be patterned (e.g., based on mesh blocks as illustrated in FIG. 3) to prevent the warpage (e.g., bending due to heat, pressure, chemical reaction, etc.) of the panel of the semiconductor package 200.

The airvent 118 (e.g., which primarily provides an escape route of the air 116 present in the mold cavity 114 as the mold cavity 114 is filled by the mold material 112) turns into a channel to contain the overflow of the mold material (e.g., in liquefied and/or solid form) from the mold cavity 114 to the outer areas of the semiconductor package 200. In one example embodiment, the airvent 118 may be formed along a nearby sawline running towards the end of the outer areas. The airvent 118 may be formed along the longitudinal sawline 206A and/or the latitudinal sawline 206B.

In another example embodiment, one or more staggered offset mesh block areas (e.g., a staggered offset mesh block area 302B of FIG. 3B) may be formed on the outer areas surrounding the product forming areas 202 to act as dam structures to minimize mold bleeding from the mold cavity 114 of the semiconductor package 200 to the outer areas 208 of the substrate surface 106.

Figure 3:
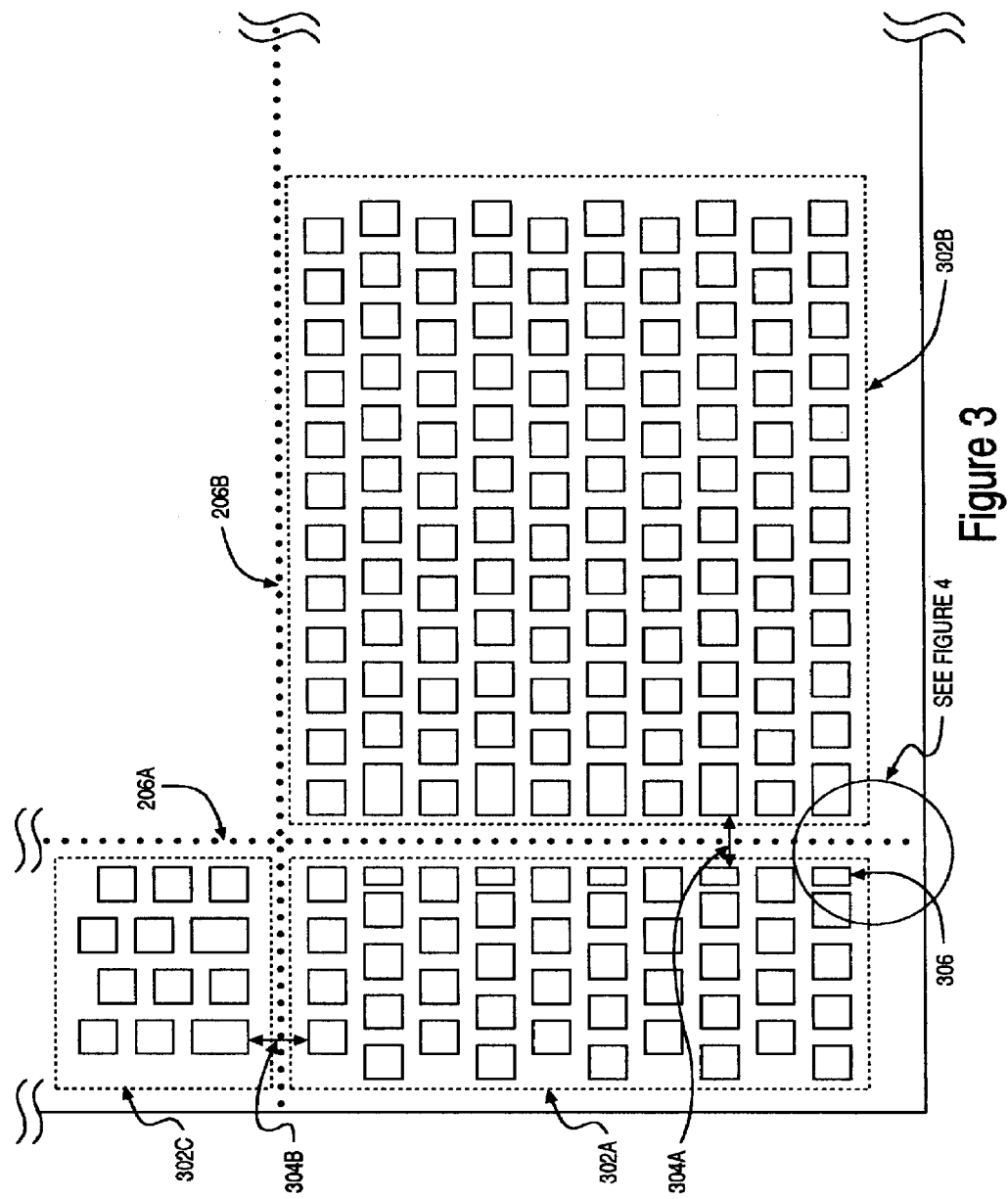
FIG. 3 is an exploded view of a gap formed by two neighboring staggered offset mesh block areas, according to one embodiment.

FIG. 3 is an exploded view of a gap formed by two neighboring staggered offset mesh block areas, according to one embodiment. FIG. 3 illustrates the longitudinal sawline 206A, the latitudinal sawline 206B, a staggered offset mesh block area 302A, a staggered offset mesh block area 302B, a staggered offset mesh block area 302C, a longitudinal gap 304A, a latitudinal gap 304B, and a mesh block 306.

In FIG. 3, the longitudinal gap 304A or the latitudinal gap 304B is formed between two neighboring staggered offset mesh block areas (e.g., between the staggered offset mesh block area 302A and the staggered offset mesh block area 302B or between the staggered offset mesh block area 302A and the staggered offset mesh block area 302C).

The longitudinal gap 304A is formed between the staggered offset mesh block area 302A and the staggered offset mesh block area 302B with its center divided by the longitudinal sawline 206A. The latitudinal gap 304B is formed between the staggered offset mesh block area 302A and the staggered offset mesh block area 302C with its center divided by the latitudinal sawline 206B.

In one example embodiment, the staggered offset mesh block areas (e.g., which obstruct the free flow of the mold material 112 of FIG. 1 with their misaligned mesh blocks) may minimize mold bleeding from the mold cavity 114 of the semiconductor package 200 to the outer area of the substrate surface 106. The mold material 112 (e.g., liquefied) may be slowed down by dam structures formed by the staggered offset mesh block areas (e.g., whereas the mold material 112 may easily flow through airvents and/or channels formed between aligned mesh blocks).

Additionally, gaps (e.g., longitudinal and/or latitudinal) formed between neighboring staggered offset mesh block areas may minimize the spread of mold bleeding outside the gaps. Alternatively, the depth and width of the gaps may be varied to prevent the spread (e.g., overflow) of the mold bleeding outside the gaps. For example, a narrow and deep gap may be more effective in preventing the spread of mold bleeding outside the gap than a wide and shallow gap.

Furthermore, individual mesh blocks of the staggered offset mesh block areas may take a shape of a triangle, a rectangle, a pentagon, a hexagon, a heptagon, and/or an octagon. Moreover, the individual mesh blocks forming the staggered offset mesh block areas may be different in size.

In another example embodiment, the individual mesh blocks (e.g., or the staggered offset mesh block areas) may be heat conductors (e.g., made of copper, aluminum, etc.) to dissipate heat away from semiconductor chips (e.g., and/or their connections) mounted on the semiconductor package during the packaging process. With this reason and more, the warpage of the panel (e.g., the substrate) of the semiconductor package may be reduced with the use of the staggered offset mesh block areas.

Figure 4:
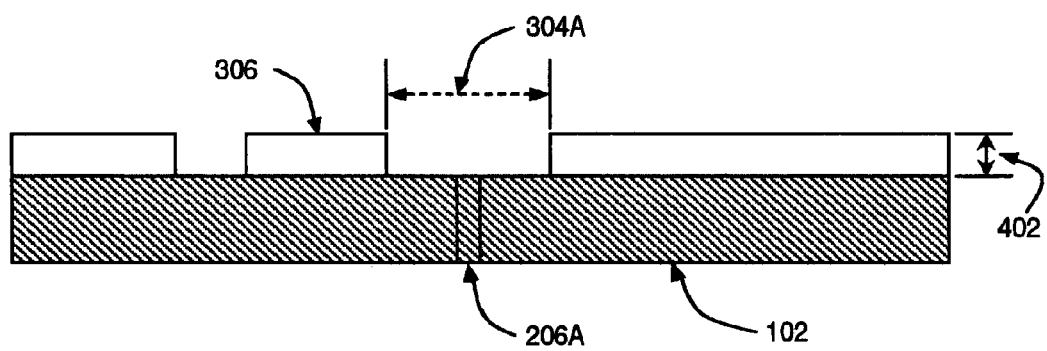
FIG. 4 is a cross sectional view of the gap of FIG. 3, according to one embodiment.

FIG. 4 is a cross sectional view of the gap of FIG. 3, according to one embodiment. FIG. 4 illustrates the substrate 102, the mesh block 306, the longitudinal sawline 206A, the longitudinal gap 304A, and a height of gap 402. In FIG. 4, the mesh block 306 (e.g., made of copper or other conductive material) is formed on the substrate 102 (e.g., through a deposition). The longitudinal gap 304A is formed between two neighboring staggered offset mesh block areas. The longitudinal sawline 206A (e.g., dividing the packaged semiconductor chips) is also formed between the two neighboring staggered offset mesh block areas.

In one example embodiment, the longitudinal gap 304A is 0.5 millimeter wide. The trace of the mold bleeding may not be so discernable (e.g., to human eyes) in the case of the 0.5 millimeter wide gap (e.g., compared to the 1.4 millimeter wide gap of the FWD 137 and/or the BNA 202). This, in turn, may make the cosmetic of the semiconductor package 200 more attractive than ones with more discernable traces of the mold bleeding.

In another example embodiment, the height of gap 402 (e.g., the height of the mesh block 306) may be adjusted (e.g., and/or set) to minimize the mold bleeding caused by the overflow of the mold material 112. If the height (e.g., depth) of gap 402 is too short, the mold material 112 may easily overflow the longitudinal gap 304A. One should also concern the thickness of the substrate 102 and the cost of patterning the staggered offset mesh block areas while setting the height of gap 402.

Figure 5:
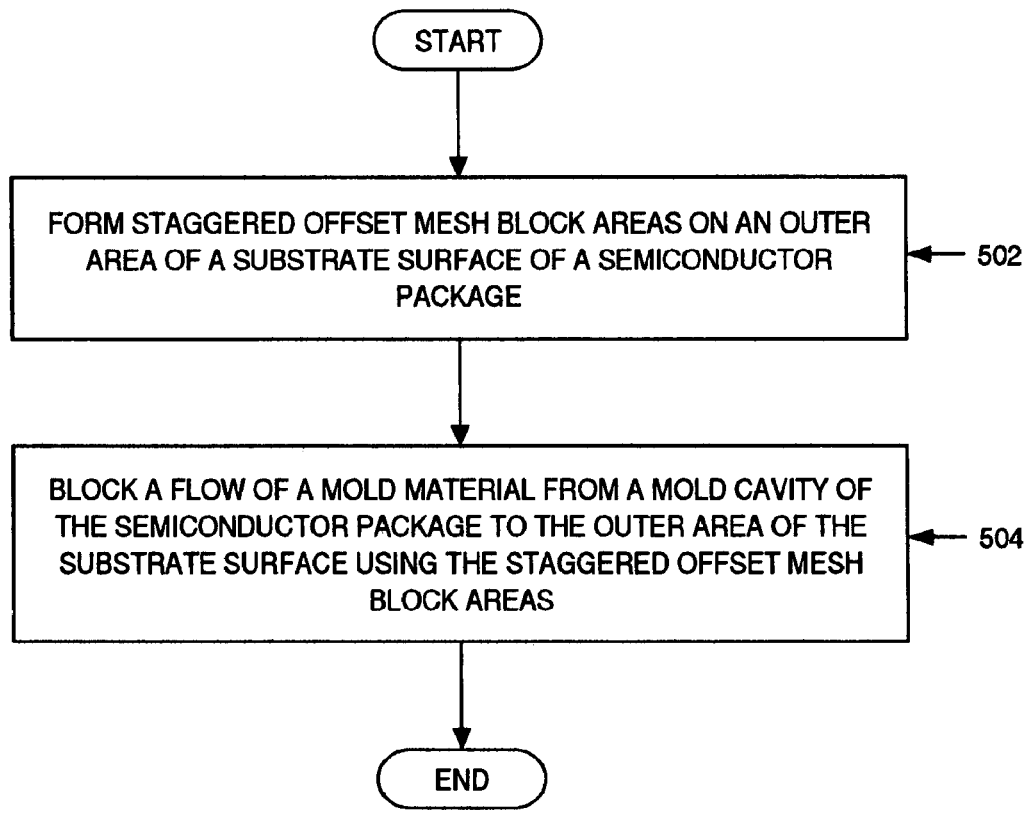
FIG. 5 is a process flow of forming staggered offset mesh block areas on the substrate surface of a semiconductor package, according to one embodiment.

FIG. 5 is a process flow of forming staggered offset mesh block areas on the substrate surface of a semiconductor package, according to one embodiment. In operation 502, one or more staggered offset mesh block areas are formed on the outer area of the substrate surface of the semiconductor package.

In operation 504, the flow of a mold material from a mold cavity of the semiconductor package to the outer area of the substrate surface is blocked using the staggered offset mesh block areas.

Figure 6:
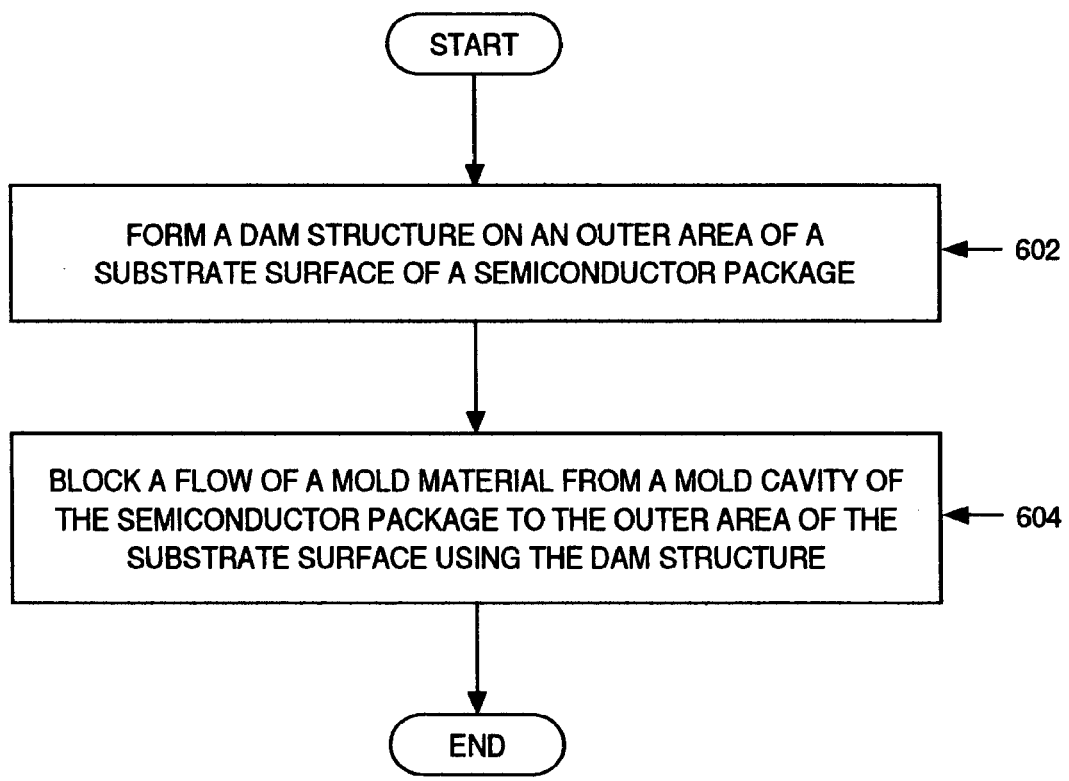
FIG. 6 is a process flow of forming a dam structure on the substrate surface of a semiconductor package, according to one embodiment.

FIG. 6 is a process flow of forming a dam structure on the substrate surface of a semiconductor package, according to one embodiment. In operation 602, a dam structure (e.g., made of staggered mesh blocks) may be formed on the outer area of the substrate surface of the semiconductor package. In operation 604, the flow of a mold material from a mold cavity of the semiconductor package to the outer area of the substrate surface is blocked using the dam structure.

In summary, embodiments described herein pertain to methods and structures that provide improved performance in the molding process of semiconductor package, and in particular, a reduction of mold bleeding on the panel surface of the semiconductor package. By reducing the mold bleeding, embodiments provide higher yield and better productivity in semiconductor manufacturing and/or process control.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A substrate surface of a semiconductor package, comprising:
   a plurality of product forming areas to provide mounting spaces of semiconductor chips; and
   a plurality of staggered offset mesh block areas surrounding the plurality of product forming areas to minimize mold bleeding from a mold cavity of the semiconductor package to outer areas of the substrate surface.

2. The substrate surface of claim 1, further comprising a gap formed between two adjacent ones of the plurality of staggered offset mesh block areas to minimize a spread of the mold bleeding outside the gap.

3. The substrate surface of claim 2, wherein a size of the gap is at most 0.5 millimeter.

4. The substrate surface of claim 2, further comprising a sawline of the semiconductor package to form on the substrate surface below the gap.

5. The substrate surface of claim 4, wherein the gap is approximately 0.04 millimeter deep.

6. The substrate surface of claim 1, wherein the plurality of staggered offset mesh blocks are arranged to minimize a warpage of the substrate surface.

7. The substrate surface of claim 1, wherein a mesh block of the plurality of staggered offset mesh block areas comprises at least one of a triangle, a rectangle, a pentagon, a heptagon, and an octagon.

8. The substrate surface of claim 1, wherein the plurality of staggered offset mesh block areas are heat conductive to dissipate heat from semiconductor chips mounted on the substrate surface.

9. The substrate surface of claim 8, wherein a mesh block of the plurality of staggered offset mesh block areas comprises copper.

10. The substrate surface of claim 1, wherein the height of a mesh block of the plurality of staggered offset mesh block areas minimizes the flow of mold material to the outer area of the substrate surface.

11. The substrate surface of claim 10, wherein the height is approximately 0.04 millimeters.

12. The substrate surface of claim 1, wherein mesh blocks of the plurality of staggered offset mesh block areas comprises various sizes.

13. A substrate surface of a semiconductor package, comprising:
   a plurality of product forming areas to provide mounting spaces of semiconductor chips; and
   a dam structure on an outer area of the substrate surface of the semiconductor package, the dam structure comprising a plurality of mesh blocks;
   a plurality of staggered offset mesh block areas surrounding the plurality of product forming areas to act as dam structures to block a flow of a mold material from a mold cavity of the semiconductor package to outer areas of the substrate surface.

14. The substrate surface of claim 13, wherein the plurality of mesh blocks form a staggering pattern.

15. The substrate surface of claim 13, further comprising a gap formed between the dam structure and a neighboring dam structure to minimize the flow of the mold material from the mold cavity to the outer area of the substrate surface.

* * * * *